United States Patent [19]

Griffin

[11] Patent Number: 4,758,776
[45] Date of Patent: Jul. 19, 1988

[54] RF INTERFEROMETER

[75] Inventor: Eric J. Griffin, Worcester, England

[73] Assignee: The Secretary of State for Defence in Her Britannic Majesty's Government of the United Kingdom of Great Britain and Northern Ireland, London, England

[21] Appl. No.: 912,235

[22] Filed: Sep. 29, 1986

[30] Foreign Application Priority Data

Oct. 8, 1985 [GB] United Kingdom ............... 8524825

[51] Int. Cl.$^4$ ............................................. G01R 27/06
[52] U.S. Cl. .............................. 324/58 B; 324/58.5 B
[58] Field of Search ...................... 324/58 B, 58.5 B

[56] References Cited

U.S. PATENT DOCUMENTS

| 4,427,936 | 1/1984 | Riblet et al. | 324/58 B |
| 4,489,271 | 12/1984 | Riblet | 324/58 B |
| 4,571,545 | 2/1986 | Griffin et al. | 324/58 B |

OTHER PUBLICATIONS

Oldfield et al., "A Multistate Reflectometer", IEEE Transaction on Instrumentation and Measurement, vol. IM-34, No. 2, Jun. 1985, pp. 198-201.
Hoer, Cletus A., "A Network Analyzer Incorporating Two Six-Port Reflectometers", IEEE Transaction on Microwave Theory and Techniques, vol. MTT-25, No. 12, Dec. 1977, pp. 1070-1074.
Weidman, Manley P., "A Semiautomated Six Port for Measuring Millimeter-Wave Power and Complex Reflection Coefficient", IEEE Transaction on Microwave Theory and Techiques, vol. MTT-25, No. 12, Dec. 1977, pp. 1083-1085.
Skilton, P. J., "A Reflectometer and Power-Ratio Technique for the Measurement of Low Values of Waveguide Attenuation", IEEE Transaction on Instrumentation and Measurement, vol. IM-25, No. 4, Dec. 1976, pp. 307-311.
Crandell et al., "Reflectometers for Millimeter-Wave Measurements", Microwave Journal, (U.S.A.), vol. 23, No. 6, pp. 60-63.

Primary Examiner—A. D. Pellinen
Assistant Examiner—Jeffrey A. Gaffin
Attorney, Agent, or Firm—William R. Hinds

[57] ABSTRACT

An RF interferometer is provided in which a power source is connected via first and second directional couplers to a load or device under test. The second coupler is connected to a second detector sampling power incident on the load. The first coupler is connected to a first detector arranged to detect power arising from vector combinations of source voltage and load-reflected voltage. The first coupler is also connected to a three position switch disposed to present any one of three reflecting arrangements to coupled source power. The reflecting arrangements consist of a short-circuited first waveguide, an open circuited second waveguide and a directional coupler having two ports remote from the switch connected together by a third waveguide. Operation of the switch furnishes three different vector combinations of source and load-reflected voltage for measurement by the first detector. This is equivalent to the result achieved by a six-port reflectometer, but with reduced dependence on the frequency stability of components.

6 Claims, 2 Drawing Sheets

RF INTERFEROMETER

This invention relates to an RF interferometer for measuring voltage reflection coefficients (VRCs) at microwave frequencies.

Various forms of apparatus for measuring the reflection coefficient of an electronic device under test (DUT) are known. One such form, the six-port reflectometer, has been the subject of appreciable research. A six-port reflectometer comprises a waveguide junction to transmit power from a source to a reflecting DUT. The power of the source radiation and three difference combinations of input and reflected voltage are detected by four detectors. The detectors are connected to four ports of the junction, the two remaining ports being connected to the source and DUT. Three relative power measurements are obtained from the ratios of the detected input/reflected power combinations to the detected input power. The VRC of a DUT is obtained by comparing the corresponding power ratio measurements with those produced by a series of calibration standards having known VCRs.

Specific six-port reflectometer designs have been published in the technical literature. in IEEE Transactions, MMT-25, pp 1075–1083 (two papers), December 1977 (Reference 1), G. F. Engen analysed reflectometer properties in terms of a diagram of the complex plane displaying an unknown reflection coefficient $\Gamma$ as a radius vector. Each of the three detected power ratios would be zero at some respective value of $\Gamma$. These three zero power points were designated by the complex numbers $q_1$, $q_2$ and $q_3$ in the complex plane. Non-zero power ratios arising from measurements on a DUT of unknown $\Gamma$ could then be represented in terms of circles centred on the corresponding q points, circle radius being proportional to square root of power ratio. The point of intersection of the three circles yielded the radius vector representing the unknown coefficient. Engen went on to describe a specific design of six-port reflectometer junction. This incorporated five four-port directional couplers (quadrature hybrids) and five lengths of waveguide, and gave broadband performance for appropriate lengths of waveguide. However, it is a major disadvantage that this design cannot be constructed in coplanar form, with many commercially available waveguide components.

In the Proceedings of the 11th European Microwave Conference, pp 501–506, 1980 (Reference 2), Hansonn et al provided a reflectometer design comprising a directional coupler connecting a source to a symmetrical five-port junction. This junction is not a commercially available broadband device, and the reflectometer as a whole is at best operative over only a one octave bandwidth for a specific circuit configuration. Its properties are analysed by Dong et al in IEEE Trans., MMT-32, No. 1, pp 51–57, Jan. 1984. For some arrangements, it is capable of single frequency operation only.

In Electronics Letters, 18, pp 491–493, June 1982 (Reference 3), E J Griffin describes a third six-port reflectometer design incorporating commercially available components, unlike Reference 2. Moreover, this design is much simpler than that of Reference 1, in that only three couplers and two lengths of waveguide are employed. Provided that the phase velocities in the waveguides and couplers are equal, and that appropriate lengths of waveguide are employed, this design is operative over a one octave bandwidth.

Applicant's co-pending United Kingdom patent application No. 8311170 dated the Apr. 25, 1983 (Reference 4), relates to a further six-port reflectometer arrangement. It employs four four-port couplers and a length of waveguide. Three of the couplers provide a series power transmission path from the power source to a DUT. The fourth coupler is doubly connected to the second coupler, one connection being direct and the other via the waveguide, and has two other ports connected to respective detectors. The waveguide angular length is arranged to equalise input and reflected wave paths to the fourth coupler. This ensures that the waveguide has the bandwidth of its components, all of which may be broadband, provided that the phase velocities in the couplers and waveguide are equal. A further advantage is that of operability at low source power levels, $\sim 50$ $\mu$W, which reduces costs and power absorbed in the DUT.

A further six-port reflectometer design is set out in applicant's co-pending British patent application No. 8413339 filed May 24, 1984 (Reference 5). This, like Reference 4, employs four four-port directional couplers and a length of waveguide, three of the couplers being arranged in series to transmit power from a source to a DUT. The fourth coupler and waveguide, however, are arranged to present a calculable reflection coefficient to one port of the second coupler. Respective measurement detectors are connected to one port of each of the first, second and third couplers, and the fourth port of the first coupler is connected to a source power or reference detector. This arrangement results in three different vector combinations of source voltage and DUT-reflected voltage being received by respective detectors to provide ratios with that detected at the reference detector. Broadband measurement performance is obtained provided that broadband components are used, one embodiment being perative over 4.3 octaves.

It is a disadvantage of known six-port junctions that they degrade the available detector signal to noise ratio by 15 dB or more. This degradation arises because the positions of the q zero power points in the complex plane previously mentioned are dictated by the relative coupling and transmission coefficients of three or more directional couplers. Frequency dependence of inter alia coupler phase tracking, directivity and detector reflection produce additional errors and corresponding signal to noise degradation. This has inhibited commercial use of six-port reflectometers despite marketing efforts.

It is an object of the present invention to provide a simpler form of microwave measuring instrument capable of improved signal to noise performance compared to prior art six-port reflectometers.

The present invention provides an RF interferometer including:

1. coupling means arranged to transmit power from a source for reflection at a device under test;
2. a first detector arranged to detect power arising from a vector combination of source voltage with voltage reflected from a device under test;
3. a second detector arranged to detect source power; and
4. switching means arranged to select any one of three different reflecting means to effect voltage reflection to the first detector, such that the first detector may receive any one of three vector combinations of source voltage with that reflected from the device under test.

The invention provides the advantage that the positions of the q circles are dependent on fewer parameters than a conventional six-port reflectometer. It is accordingly inherently more frequency stable and exhibits less degradation of available detector signal to noise performance than the prior art.

In one embodiment, the coupling means may be a series arrangement of first and second four-port directional couplers. The first coupler has a first port connected to a power source, a second port connected to a first port of the second coupler, and third and fourth ports connected respectively to the switching means and the first detector. The second coupler has second, third and fourth ports connected respectively to the device under test, the second detector and a matched load. The second coupler may alternatively be a three-port device or a power splitter for which an externally connected matched load is not required. The switching means may be a three position, single pole switch having prearranged reflectors connected to its positions. It may be implemented by PIN diodes. The reflectors may be a short-circuited first waveguide, a second waveguide connected to an open circuit and a third coupler having two ports remote from the switch connected by a third waveguide. The second detector detects source power, and the first detector receives voltages reflected from the DUT combined vectorially with any one of three different voltages returning from the switching means; the first detector responds to the square of the amplitude of the vector sum of the combined voltages. In this embodiment the first coupler may be replaced by an equivalent bridge network.

In order that the invention might be more fully understood, embodiments thereof will now be described, by way of example only, with reference to the accompanying drawings, in which.

Figure 5:
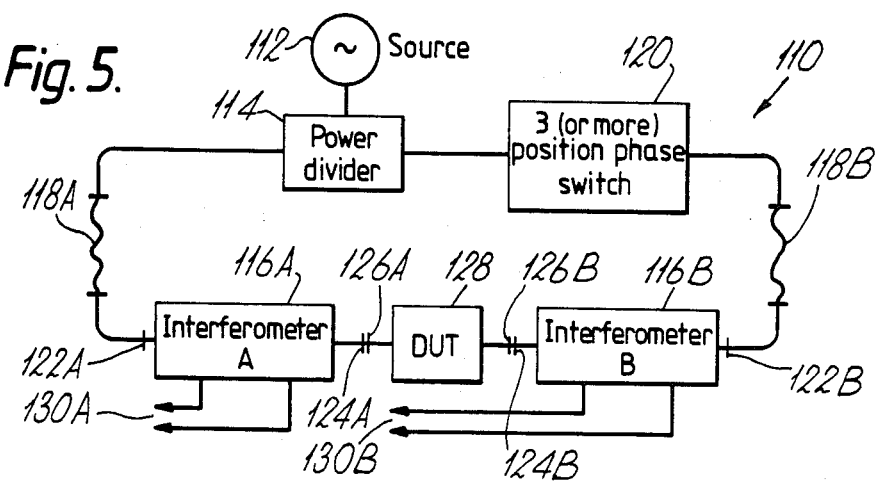

FIG. 5 schematically shows a network analyser incorporating two interferometers of the invention.

Figure 1:
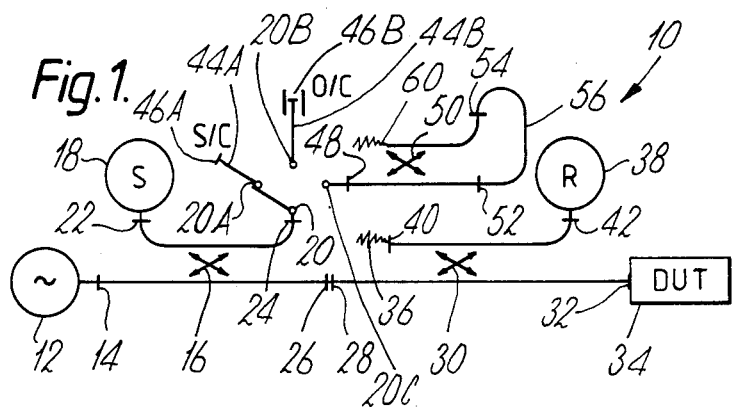
FIG. 1 is a schematic drawing of an RF interferometer of the invention.

Referring to FIG. 1, there is shown a schematic illustration of a microwave interferometer 10 of the invention. It comprises a microwave power source 12 connected to an input port 14 of a first four-port forward directional coupler indicated conventionally by crossed arrows 16. A first square-law power detector diode 18 (S) and a single pole, three-position switch 20 are connected respectively to second and third ports 22 and 24 of the first coupler 16. A fourth port 26 of the coupler 16 is connected to a first port 28 of a second equivalent four-port directional coupler 30. The second coupler 30 has a second or measurement port 32 connected to a DUT 34. A matched (absorbing) load 36 and a second or reference detector 38 (R) are connected respectively to third and fourth ports 40 and 42 of the second coupler 30. The detector 38 is a square law, power detecting diode equivalent to the first detector 18.

The switch 20 has three positions 20A, 20B and 20C providing alternative connections to the third port 24 of the first coupler 16. Positions 20A and 20B are connected by first and second waveguides 44A and 44B to a short circuit 46A and a variable open circuit 46B respectively. Position 20C is connected to a first or input port 48 of a third four port directional coupler 50. This coupler has second and third ports 52 and 54 connected together by a third waveguide 56, and its fourth port is connected to a matched load or absorber 60. The waveguides 44A, 44B and 56 have respective angular lengths $\alpha$, $\beta$ and $\gamma$.

The interferometer 10 operates as follows. Microwave power from the source 12 passes into the first coupler 16 and is partly coupled to the switch 20 and partly transmitted to the second coupler 30. Here the power is partly coupled to the second detector 38 and partly transmitted for reflection by the DUT 34. Reflected power is partly coupled to the matched load 36, and partly transmitted back to the first coupler 16 for coupling to the first detector 18.

Microwave power coupled to the switch 20 is reflected back via one of the three different routes available in accordance with the switch position setting 20A, 20B or 20C. The short circuit 46A, variable open circuit 46B, third coupler 50 and their respective lengths of waveguide provide three different reflection coefficients, as will be described. The first detector 18 receives power transmitted to it from the switch 20 combined with power coupled to it which has been reflected by the DUT 34. Three different measurements of power at detector 18 are accordingly available by changing the position of the switch 20, thereby changing the power reflected for combination with that returning from the DUT 34.

The theory of operation of the interferometer 10 is as follows. If the switch 20 were replaced by a matched load or absorber, the result would be a simple reflectometer suitable for measuring only the modules $|\Gamma|$ of an unknown complex voltage reflection coefficient $\Gamma$. The switch 20 provides the facility of connecting in reflectors with, for ideal components, unity magnitude and two successive 90° phase shifts, and these are substantially frequency independent. The power measured by detector 18 accordingly arises from interference between waves returning from the switch 20 and the DUT 34.

Let coupler ports 14, 32, 42, 22 and adjacent ports 26/28 be referred to as ports 1, 2, 3, 4 and 5 respectively to provide convenient indices. The voltages incident on and reflected from port n (n=1 to 5) are then defined as $a_n$ and $b_n$ respectively. The voltage transmission and coupling coefficients of the mth coupler are defined as $t_m$ and $c_m$, where $|t_m|^2 + |jc_m|^2 = 1$ and m=1, 2 and 3 for couplers 16, 30 and 50 respectively. The transmission paths through the switch 20 are designated $\delta_A$, $\delta_B$ and $\delta_C$ for switch positions 20A, 20B and 20C. As has been mentioned, short circuit 46A and open circuit 46B are connected to switch positions 20A and 20B by waveguides of angular length $\alpha$ and $\beta$ respectively, and a waveguide of angular length $\gamma$ connects third coupler ports 52 and 54. Successive positions 20A, 20B and 20C accordingly present the first coupler port 24 with reflection coefficients $\Gamma_k$, where k=1, 2 or 3 and $\Gamma_1 = -e^{-j(\delta_A + \alpha)}$, $\Gamma_2 = +e^{-j(\delta_B + \beta)}$ and $\Gamma_3 = +j2c_3t_3e^{-j(\delta_C + \gamma)}$. For measurement purposes, the interferometer 10 is equivalent to a four port waveguide junction to which a source, a device under test and two detectors are connected. This junction has ports 1 to 4 as previously mentioned which may be described by scattering coefficients $S_{ij}$. The first and second detectors 18 and 38 are designated R and S with reflection coefficients $\Gamma_R$ and $\Gamma_S$ respectively. It follows that, for each position of a repeatable switch 20:

$$\begin{bmatrix} b_1 \\ b_2 \\ 0 \\ 0 \end{bmatrix} = \begin{bmatrix} s_{11} & s_{12} & s_{13}\Gamma_R & s_{14}\Gamma_S \\ s_{21} & s_{22} & s_{23}\Gamma_R & s_{24}\Gamma_S \\ s_{31} & s_{32} & (\Gamma_R s_{33} - 1) & s_{34}\Gamma_S \\ s_{41} & s_{42} & s_{43}\Gamma_R & (\Gamma_S s_{44} - 1) \end{bmatrix} \begin{bmatrix} a_1 \\ a_2 \\ b_3 \\ b_4 \end{bmatrix} \quad (1)$$

The determinant of the $[S_{ij}]$ square matrix is non-zero so it may be inverted. Its inverse for state k of the switch is denoted by $[M]_k$ with elements $m_{ij}$ so that:

$$\begin{bmatrix} a_1 \\ a_2 \\ b_3 \\ b_4 \end{bmatrix} = [M]_k \begin{bmatrix} b_1 \\ b_2 \\ 0 \\ 0 \end{bmatrix} \quad (2)$$

$$\left.\begin{array}{l} a_1 = m_{11}b_1 + m_{12}b_2 \\ a_2 = m_{21}b_1 + m_{22}b_2 \\ b_i = m_{i1}b_1 + m_{i2}b_2 \text{ where } i = 3 \text{ or } 4 \end{array}\right\} \text{for each } k = 1, 2 \text{ or } 3 \quad (3)$$

$$\therefore b_1 = (a_2 - m_{22}b_2)/m_{21} \text{ for } k = 1, 2 \text{ or } 3. \quad (4)$$

But $\Gamma = a_2/b_2$, the ratio of incident and reflected amplitudes at the second port to which DUT 34 is connected:

$$\therefore (b_4)_k = \left(\left(\frac{m_{41}}{m_{21}}\right)_k \Gamma + ((m_{42})_k - (m_{22}m_{41}/m_{21})_k)\right) b_2 \quad (5)$$

Equation (5) may be written as:

$$(b_4)_k = (\mu_k \Gamma + \nu_k)b_2 \quad (6)$$

where $k = 1, 2, 3$ and $\mu_k = (m_{41}/m_{21})_k \quad (7)$ and $\nu_k = ((m_{42})_k - (m_{22}m_{41}/m_{21})_k) \quad (8)$ To the extent that the switch paths repeat, $\mu_k$ and $\nu_k$ repeat also. A similar analysis for the invariant junction having ports 5, 2, 3 can be performed to show that:

$$b_3 = (\mu_3 \Gamma + \nu_3)b_2 \quad (9)$$

where $\mu_3$ and $\nu_3$ are invariant. Hence:

$$\frac{(b_4)_k}{b_3} = \frac{\mu_k \Gamma + \nu_k}{\mu_3 \Gamma + \nu_3} \quad (10)$$

The invention may incorporate square law detectors such as diodes or temperature dependent resistors each connected in a self-balancing bridge. Moreover, the detector scale factors may be absorbed, allowing Equation (10) to be written:

$$\sqrt{(S/R)_k} = |W_k| = |d_k\Gamma + e_k|/|c\Gamma + 1| \quad (11)$$

where $k=1$, 2 or 3, $(S/R)_k$ is the kth ratio of power absorbed by the detectors 18 and 38 measured at a respective position of switch 20, and $W_k$ is a vector $(u+jv)$, a bilinear transformation of $\Gamma = (x+jy)$ and $c = \mu_3/\nu_3$, $d_k = \mu_k/\nu_3$, $e_k = \mu_k/\nu_3$ Equation (11) is equivalent to that for a prior art six-port reflectometer comprising an invariant (non-switchable) junction with four detectors. Following the prior art, $S=0$ for each of $k=1$, 2 or 3 defines a respective kth zero power point or centre $q_k$ in the complex plane. An unknown value of $\Gamma$ is then determined by the point of intersection of circles of radius $\sqrt{(S/R)_k}$ each centered on a respective $q_k$.

If it is assumed that the interferometer 10 has matched lossless components and directional couplers with infinite directivity and perfect phase quadrature, then simple circuit theory shows that:

$$\sqrt{(S/R)_k} = (c_1 t_2^2/c_2)|\Gamma + \Gamma_k/t_2^2| \quad (12)$$

The interferometer 10 may be constructed so that:

$\delta_A + \alpha = \delta_B + \beta = \frac{1}{2}(\delta_C + \gamma),$ $c_1^2 = t_1^2 = 0.5$ (3 dB coupling), $c_2^2 = 0.1$ and $t_2^2 = 0.9$ (10 dB coupling)

Figure 2:
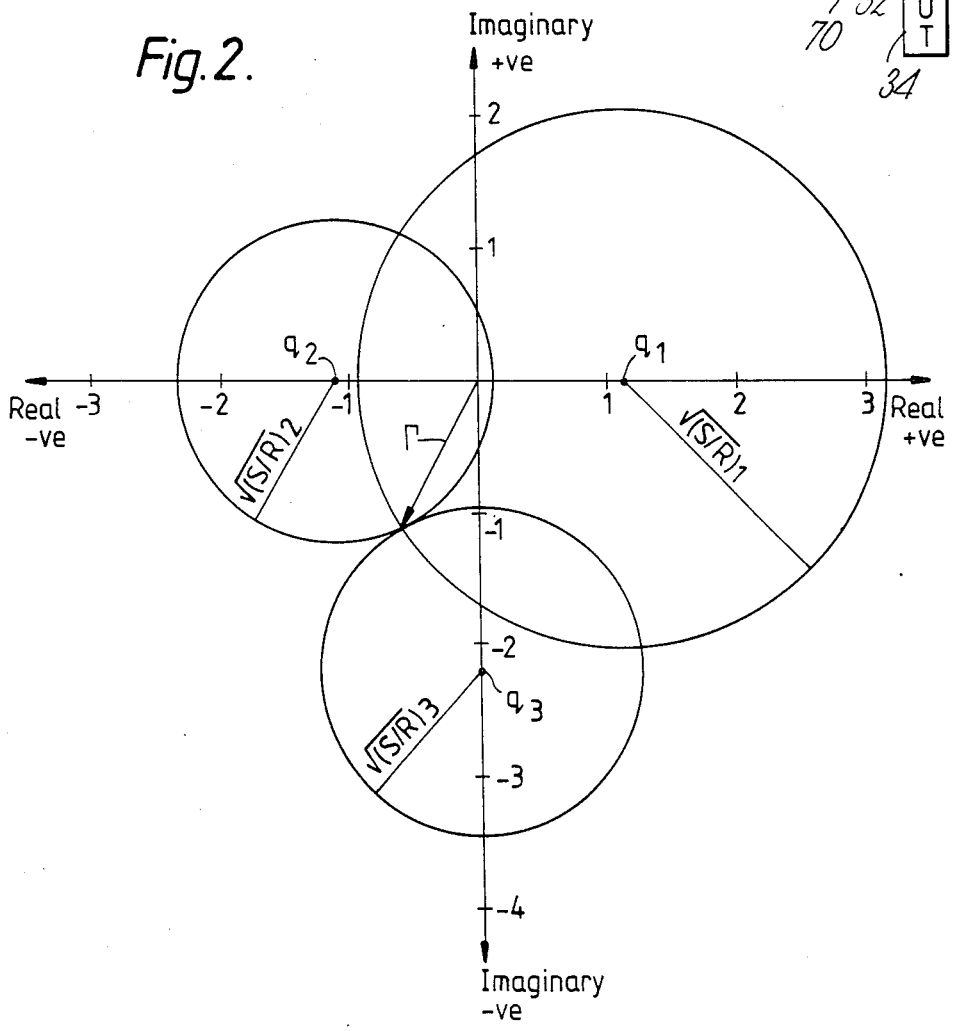
FIG. 2 is a drawing of the complex plane in which the q circles are drawn for a particular value of Γ measured by one embodiment of the FIG. 1 interferometer.

This reduces Equation (12) to:

$$\sqrt{(S/R)_k} = 2.85|\Gamma - q_k| \quad (13)$$

where $q_1 = (1.1 + jO)$, $q_2 = (-1.1 + jO)$ and $q_3 = (0 - j2.2c_3t_3)$. If $c_3^2 = t_3^2 = 3$ dB, all $q_k$ are at radius 1.1 from the origin $\Gamma = 0$; the angular positions of $q_1$ and $q_2$ are frequency independent to the extent that $t_2^2$ is, whilst that of $q_3$ is dependent on $t_2^2$ together with $c_3t_3$. FIG. 2 shows the positions of $q_k$ with circles centred thereon intersecting an unknown reflection coefficient $\Gamma$.

An interferometer in accordance with the invention can provide superior measurement properties when compared to prior art six-port reflectometers. A practical prior art six-port junction is characterised by three $q_k$ zero power points or power circle centres; the positions of these centres is dictated by the relative coupling and transmission coefficients c, t of three or more directional couplers, with associated errors arising from frequency dependence of phase tracking, directivity, reflection from four detectors etc. Accordingly, the prior art $q_k$ points are dependent on the frequency variation of at least ten parameters, ie six coupling/transmission coefficients and four detector reflectances. This can be shown to degrade the available detector signal to noise ratio by 15 dB or more. In comparison, an interferometer of the invention provides $q_k$ points which are dependent on the frequency variation of only six parameters, $t_2^2$, $c_3$, $t_3$ two detector reflectances and switch 20 repeatability. The invention is therefore fundamentally capable of providing a greater degree of frequency invariance of $q_k$ position than the prior art, with consequently less degradation in available detector signal to noise ratio. Furthermore, only one measure and one reference detector are used, as opposed to three measurement and one reference detector in the prior art.

A practical embodiment of the FIG. 1 arrangement has been constructed for the 0.1 to 1 GHz frequency range. It incorporates an electromechanical switch 20 and 3 dB couplers 16, 30 and 50 type QHM-3-0.675G manufactured by Merrimac Industries Inc., an American company.

Broadly speaking, the FIG. 1 interferometer 10 can be said to operate by successively combining three source derived signals (differing in phase and amplitude) with that reflected from the device under test 34. It is possible to invert this arrangement by exchanging the positions of S detector 18 with that of switch 20 and its associated circuitry, and exchanging R detector 38 with matched load 36. The effect is that three different signals are then detected at S from the DUT-reflected signal for combination with an invariant source-derived signal detected at R. The ratios required are then $(R/S)_k$. The theoretical analysis then differs so that foregoing, but an equivalent is elementary and will not be described. This arrangement is however less advantageous because the device under test is mismatched to the power source.

Figure 3:
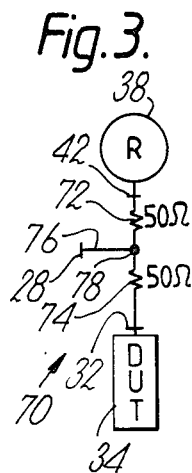
FIG. 3 shows a power splitter suitable for replacing the second coupler in FIG. 1.

Referring now to FIG. 3, in which parts previously mentioned are like referenced, there is schematically shown a power splitter 70 suitable for replacing the second coupler 30 of FIG. 1. The power splitter 70 comprises two 50 ohm chip resistors 72 and 74 arranged in series between R detector 38 at port 42 and the device under test 34 at port 32. The resistors 72 and 74 are connected to a schematically illustrated coaxial T connector 76 having a central point 78 providing a virtual earth. The T connector 76 is also connected to port 26 of the first coupler 16 (not shown). The effect of the virtual earth at 78 and the resistors 72 and 76 is to furnish detector 38 and DUT 34 with a common nearly matched source. A similar power splitter device may be employed to replace the third coupler 50.

A directional coupler is electrically equivalent to a bridge network. The first coupler 16 may accordingly be replaced by a bridge network having appropriate coupling characteristics.

Figure 4:
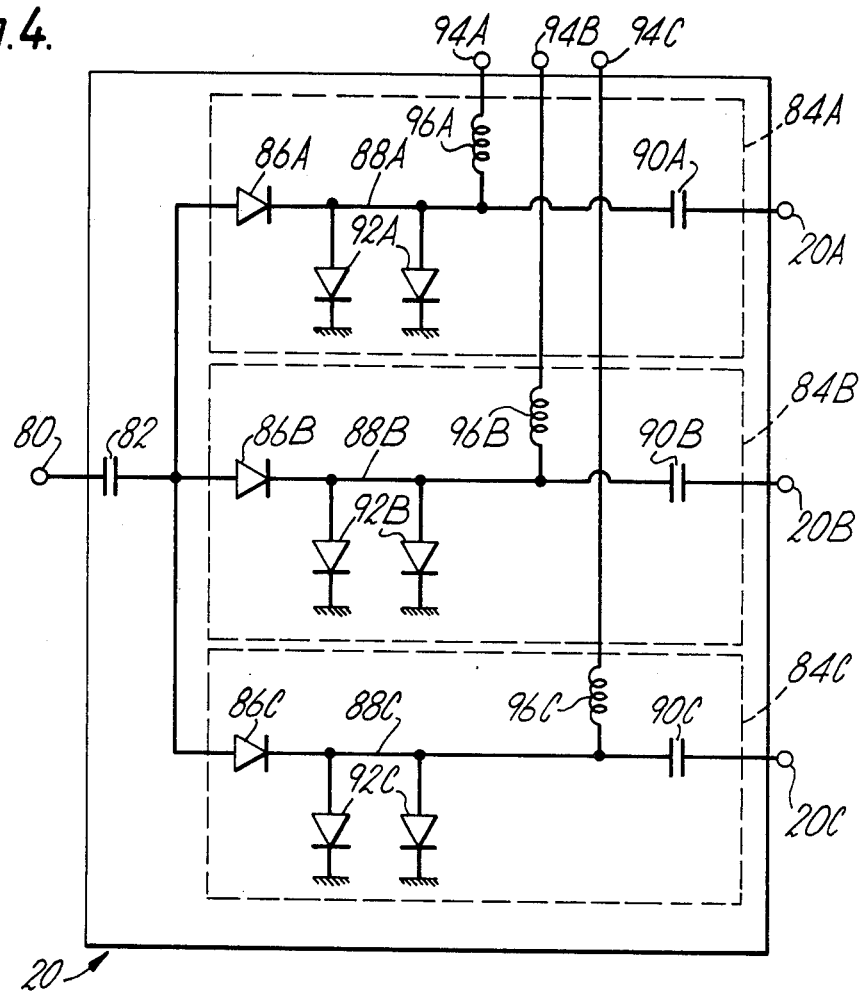
FIG. 4 is a drawing of a three-position switch implemented by PIN diodes.

Referring now to FIG. 4, in which parts previously mentioned are like referenced, there is shown a PIN diode implementation of the switch 20 of FIG. 1. The switch 20 has an input terminal 80 for connection to port 24 of the first coupler 16 (not shown). The input terminal 80 is connected to three output terminals or switch positions 20A, 20B and 20C via an input capacitor 82 and three circuits of the same kind indicated generally by 84A, 84B and 84C. Circuit 84A comprises a first PIN diode 86A connected by a line 88A to an output capacitor 90A. Two PIN diodes 92A are connected from the line 88A to earth. The circuit 84A has a DC bias input terminal 94A connected via an inductor 96A to the line 88A. Circuits 84B and 84C have equivalent elements 86B and 96B and 86C to 96C.

The switch 20 operates as follows. With the diode polarities illustrated, when a negative DC bias is applied to terminal 94A, diode 86A is forward biassed and diodes 92A reverse biassed. This provides a low impedance path connecting input terminal 80 to switch position 20A, this path being isolated from earth by a high impedance. A positive DC bias at terminal 94A reverse biases diode 86A and forward biases diodes 92A. Diode 86A accordingly becomes high impedance and line 88A is connected by a low impedance to earth. This isolates input terminal 80 from switch position 20A and effectively earths line 88A. Circuits 84B and 84C operate similarly. Accordingly, to select any one of the switch positions 20A to 20C, the corresponding DC bias input terminal is negatively biassed and the other two equivalent terminals are biassed positive.

A PIN diode switch of the kind illustrated in FIG. 4 is manufactured in microstrip form by the General Microwave Corporation, an American company, and is designated F9130. It has an isolation of 60→50 dB, a maximum insertion loss of 1.5 to 2.0 dB and a voltage standing wave ratio of 1.75 to 2.0 dB. It is suitable for use at frequencies in the range 1 to 18 GHz. Such a switch may be employed with 3 dB couplers manufactured by Krytar Inc., an American company, and designated Model 1831. Such couplers are suitable for the same frequency range. Their coupling coefficients are $3\pm0.5$ dB, with phase imbalance of $\pm10\%$ and insertion loss of <1.8 dB.

As is known in the art, couplers 16, 30 and 50 may be implemented in microstrip in combination with a microstrip PIN diode switch construction. Such a combination would be very compact and ideally suitable for providing a semiconductor test station.

With appropriate temperature control and isolation, PIN diode switches have proved repeatable to 0.0002 dB/hour in the 0.05 to 18 GHz band. As an alternative, a three way switch implemented by two coaxial changeover switches in series produces a peak to peak variation of 1.0° in Γ measurement at 18 GHz with negligible amplitude variation. Multiway coaxial switches exhibit an attenuation variation ≲0.002 dB at 12.4 GHz.

Referring now to FIG. 5, there is shown a block diagram of a dual interferometer network analyser indicated generally by 110. The analyser 110 comprises a microwave power source 112 connected to a power divider 114. The divider 114 is arranged to energise two interferometers 116A and 116B of the invention, one directly via a flexible coupling 118A and the other via a multiposition phase switch 120 and second flexible coupling 118A. The interferometers have respective power input ports 122A and 122B each equivalent to port 14 of interferometer 10 of FIG. 1. They also have measurement ports 124A and 124B, equivalent to port 32 of interferometer 10, to which are connected respective ports 126A and 126B of a DUT or network under test 128. Each interferometer has two DC outputs 130A and 130B respectively, these providing S and R signals from respective detectors (not shown) equivalent to detectors 18 and 38 in FIG. 1. These signals pass to computing means (not shown) of known and commercially available kind for calculating network parameters.

The network analyser 110 measures the complex reflection coefficients at the two ports 126A and 126B of the DUT or network under test 128. From these the properties of the network 128 can be deduced as discussed in the following:

(a) G F Engen and C A Hoer: "Thru-reflect-line": an improved technique for calibrating the dual six-port network analyser. IEEE Trans. MTT-27 pp 987–993 December 1979.

(b) T E Hodgetts and E J Griffin: "A unified treatment of the theory of six-port reflectometer calibration using the minimum of standards". RSRE Report No 83003, August 1983, (British Ministry of Defence)—available from the British Library.

I claim:

1. In an RF interferometer of the kind including coupling means arranged to transmit power from a source for reflection at a device under test and first and second detectors connected to the coupling means, the first detector being arranged to detect power arising from vector combinations of source voltage with voltage reflected from a device under test and the second detector being arranged to detect source power, the improvement comprising the interferometer also including a single pole, multi-way switch arranged to select in sequence each of three different reflectors having differing reflection coefficients, the switch being connected to the coupling means so as to effect switchable voltage reflection to the first detector providing the first detector with three successive differing vector combinations of source voltage with voltage reflected from a device under test.

2. An interferometer according to claim 1 wherein the coupling means is a series arrangement of first and second coupling devices.

3. An interferometer according to claim 2 wherein the first coupling device is a four-port forward directional coupler.

4. An interferometer according to claim 3 wherein the first coupling device is connected to the first detector and to the switching means.

5. An interferometer according to claim 2 wherein the second coupling device is connected to the second detector and the device under test and comprises any one of a directional coupler and a power splitter.

6. An RF interferometer including:
(1) coupling means arranged to transmit power from a source for reflection at a device under test;
(2) a first detector arranged to detect power arising from a vector combination of source voltage with voltage reflected from a device under test;
(3) a second detector arranged to detect source power; and
(4) switching means arranged to select any one of three different reflecting means to effect voltage reflection to the first detector, such that the first detector may receive any one of three different vector combinations of source voltage with voltage reflected from a device under test, the three reflecting means comprising a first waveguide connected to a short circuit, a second waveguide connected to an open circuit and a coupling device having two ports remote from the switching means connected together via a third waveguide.

* * * * *